(12) United States Patent
Wang (10) Patent No.: US 11,053,116 B2
(45) Date of Patent: Jul. 6, 2021

(54) MEMS ACOUSTIC PRESSURE SENSOR DEVICE AND METHOD FOR MAKING SAME

(71) Applicant: PixArt Imaging Incorporation, HsinChu (TW)

(72) Inventor: Chuan-Wei Wang, Hsinchu (TW)

(73) Assignee: PIXART IMAGING INCORPORATION, Hsin-Chu (TW)

( * ) Notice: Subject to any disclaimer, the term of this patent is extended or adjusted under 35 U.S.C. 154(b) by 149 days.

(21) Appl. No.: 16/100,447

(22) Filed: Aug. 10, 2018

(65) Prior Publication Data

US 2018/0346320 A1 Dec. 6, 2018

Related U.S. Application Data

(63) Continuation of application No. 15/494,535, filed on Apr. 23, 2017, now Pat. No. 10,081,538, which is a continuation of application No. 13/068,554, filed on May 14, 2011, now abandoned.

(30) Foreign Application Priority Data

Mar. 18, 2011 (TW) .................................. 100109392

(51) Int. Cl.
| | |
|---|---|
| *H01L 29/82* | (2006.01) |
| *B81B 7/00* | (2006.01) |
| *G01L 9/00* | (2006.01) |
| *H01L 49/02* | (2006.01) |
| *B81B 3/00* | (2006.01) |
| *B81C 1/00* | (2006.01) |

(52) U.S. Cl.
CPC ............ *B81B 7/0061* (2013.01); *B81B 3/007* (2013.01); *B81C 1/00309* (2013.01); *G01L 9/0073* (2013.01); *H01L 28/00* (2013.01); *B81B 2201/0257* (2013.01); *B81B 2201/0264* (2013.01); *B81B 2203/0127* (2013.01); *B81B 2203/0315* (2013.01); *B81B 2203/04* (2013.01); *B81C 2201/0109* (2013.01)

(58) Field of Classification Search
USPC .......................... 257/416, E21.002, E29.324
See application file for complete search history.

(56) References Cited

U.S. PATENT DOCUMENTS

2005/0000932 A1* 1/2005 Gabriel .................... H01G 5/16
216/2
2010/0230767 A1* 9/2010 Takagi ................ B81C 1/00246
257/417

* cited by examiner

*Primary Examiner* — Samuel A Gebremariam
(74) *Attorney, Agent, or Firm* — Tung & Associates (57) ABSTRACT

The present invention discloses a Micro-Electro-Mechanical System (MEMS) acoustic pressure sensor device and a method for making same. The MEMS device includes: a substrate; a fixed electrode provided on the substrate; and a multilayer structure, which includes multiple metal layers and multiple metal plugs, wherein the multiple metal layers are connected by the multiple metal plugs. A cavity is formed between the multilayer structure and the fixed electrode. Each metal layer in the multilayer structure includes multiple metal sections. The multiple metal sections of one metal layer and those of at least another metal layer are staggered to form a substantially blanket surface as viewed from a moving direction of an acoustic wave.

8 Claims, 7 Drawing Sheets

MEMS ACOUSTIC PRESSURE SENSOR DEVICE AND METHOD FOR MAKING SAME

CROSS REFERENCE

This is a Continuation of U.S. application Ser. No. 13/068,554, filed on May 14, 2011 which claims priority to TW 100109392, filed on Mar. 18, 2011. This is a continuation of U.S. application Ser. No. 15/494,535, filed on Apr. 23, 2017.

BACKGROUND OF THE INVENTION

Field of Invention

The present invention relates to a Micro-Electro-Mechanical System (MEMS) acoustic pressure sensor device and its manufacturing method, in particular to such device that includes a multilayer structure having multiple metal sections, wherein the multiple metal sections of one metal layer and those of at least another metal layer are staggered, and a method for making such device.

Description of Related Art

Figure 1:
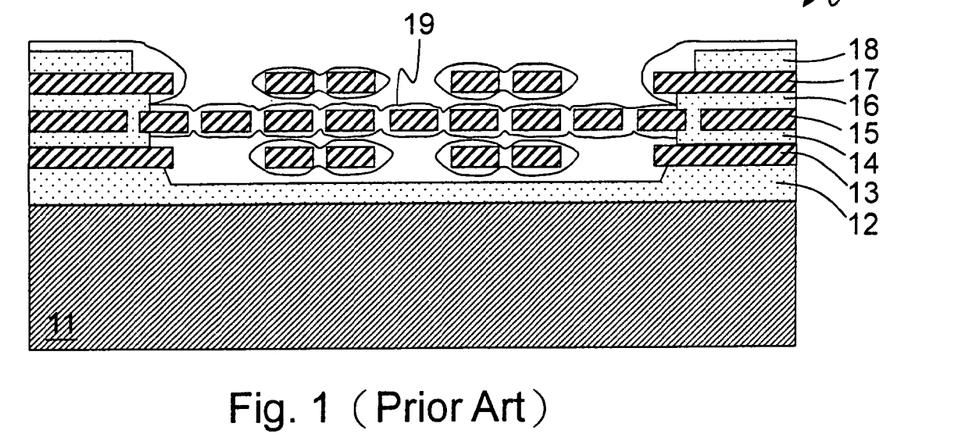
FIG. 1 shows a multilayer MEMS structure disclosed in U.S. Pat. No. 7,202,101.

FIG. 1 shows a multilayer MEMS structure disclosed in U.S. Pat. No. 7,202,101. As shown in FIG. 1, the multilayer MEMS structure 10 is formed on a substrate 11 and it includes: a sacrificial layer 12 formed on the substrate 11; a fixed electrode 13; a sacrificial layer 14; a first metal layer 15 formed on the sacrificial layer 14; a sacrificial layer 16; a second metal layer 17 formed on the sacrificial layer 16; a sacrificial layer 18; and a flexible or movable diaphragm 19 formed by sealing each metal layer with a polymer film.

In this prior art, the first metal layer 15 is a mesh-shaped metal layer to improve the properties of the MEMS acoustic pressure sensor device, wherein the mesh metal layer allows etching vapor to pass through the metal layers so that the etching vapor can react with and remove the desired portions of the sacrificial layers 12, 14, 16 and 18. In addition, the mesh metal layer 15 also alleviates the stress issue of the multilayer MEMS structure.

However, this mesh metal layer decreases the sensitivity of acoustic pressure and restricts the applications of the MEMS device. To counter, a part of the sacrificial layers 12, 14, 16 and 18 is removed, and a polymer material is deposited around each mesh metal layer for sealing each mesh metal layer so that the sensitivity can be enhanced thereby. Nevertheless, this polymer deposition process is not commonly available in a CMOS manufacturing fab, and it is difficult to integrate the polymer deposition process with the current CMOS manufacturing process.

For reference, U.S. Pat. Nos. 6,622,368, 7,049,051, 7,190,038 and 6,936,524 disclose other related MEMS acoustic pressure sensor devices.

In the view of above, to overcome the drawback in the prior art, the present invention proposes a multilayer structure with staggered metal layers and its manufacturing method.

SUMMARY OF THE INVENTION

An objective of the present invention is to provide a MEMS acoustic pressure sensor device.

Another objective of the present invention is to provide a method for manufacturing a MEMS acoustic pressure sensor device.

To achieve the foregoing objectives, in one perspective of the present invention, it provides a MEMS acoustic pressure sensor device comprising: a substrate; a fixed electrode provided on the substrate; and a multilayer structure including: multiple metal layers; and multiple metal plugs connecting the multiple metal layers; wherein a cavity is formed between the multilayer structure and the fixed electrode, and each metal layer in the multilayer structure includes multiple metal sections, wherein the multiple metal sections of one metal layer and those of at least another metal layer are staggered to form a substantially blanket surface as viewed from a moving direction of an acoustic wave.

In another perspective of the present invention, it provides a method for manufacturing a MEMS acoustic pressure sensor device, the method comprising: providing a substrate; forming a fixed electrode on the substrate; forming at least one sacrificial layer; forming multiple metal layers on the sacrificial layer, the multiple metal layers having multiple metal sections, respectively; and forming multiple metal plugs for connecting the multiple metal layers to form a multilayer structure, wherein the multiple metal sections of one metal layer and those of at least another metal layer are staggered to form a substantially blanket surface as viewed from a moving direction of an acoustic wave; and removing the sacrificial layer to form a cavity.

The foregoing MEMS acoustic pressure sensor device preferably further comprises a supporting structure fixed on the substrate and connected with the multilayer structure for supporting the multilayer structure.

The foregoing MEMS acoustic pressure sensor device preferably further comprises an insulating layer connected between the supporting structure and the substrate.

In the foregoing MEMS acoustic pressure sensor device, each multiple metal layer preferably overlaps a portion of at least another metal layer from top view.

In the foregoing MEMS acoustic pressure sensor device, the multilayer structure preferably includes at least one opening at a lateral side of the multilayer structure.

In the foregoing MEMS acoustic pressure sensor device, the substrate preferably includes at least one vent.

In the foregoing MEMS acoustic pressure sensor device, each metal layer preferably includes at least one material of gold, silver, titanium, tantalum, copper, aluminum, titanium carbide, tantalum carbide, copper carbide, aluminum carbide, titanium oxide, tantalum oxide, copper oxide, aluminum oxide, titanium nitride, tantalum nitride, copper nitride, or aluminum nitride.

In the foregoing MEMS acoustic pressure sensor device, each metal plug preferably includes at least one material of tungsten, gold, silver, titanium, tantalum, copper, aluminum, tungsten carbide, titanium carbide, tantalum carbide, copper carbide, aluminum carbide, tungsten oxide, titanium oxide, tantalum oxide, copper oxide, aluminum oxide, tungsten nitride, titanium nitride, tantalum nitride, copper nitride, or aluminum nitride.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustration only, to show the interrelations between the layers and the process steps, but not drawn according to actual scale.

Figure 2A:
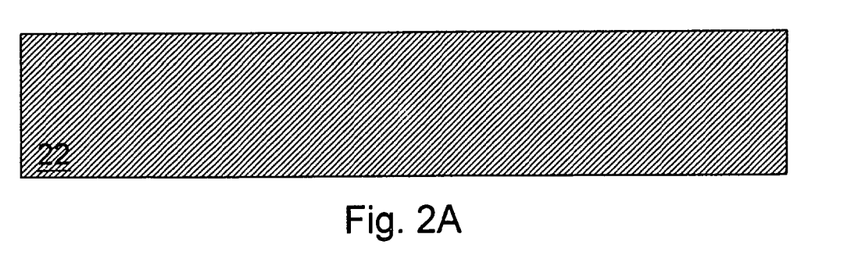
FIGS. 2A-2J illustrate, by cross-section view, a manufacturing process according to a first embodiment of the present invention.
Figure 2B:
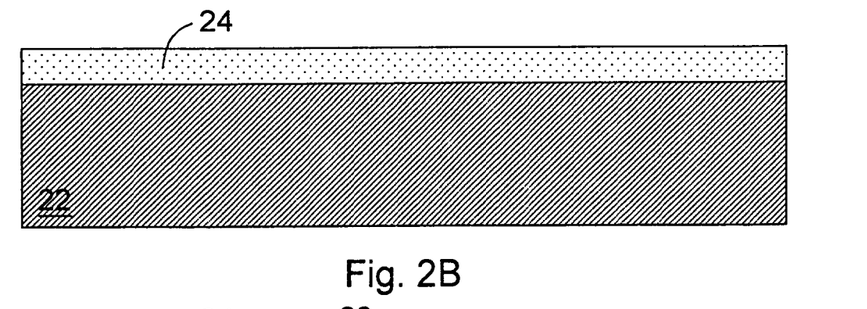
Figure 2C:
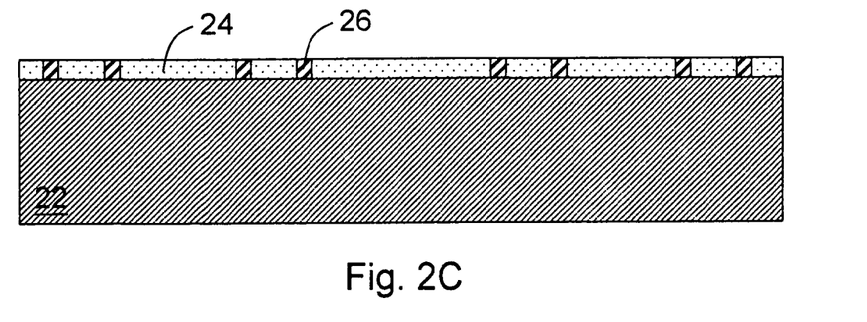

FIGS. 2A-2J illustrate, by cross-section view, a manufacturing process according to a first embodiment of the present invention. As shown in FIG. 2A, a substrate 22 is provided, and the substrate 22 may be, for example but not limited to, a silicon substrate. As shown in FIG. 2B, a sacrificial layer 24 is formed on the substrate 22, which may include, for example but not limited to, a dielectric material of silicon dioxide, fluorine-doped silicon dioxide, silicon nitride, silicon oxynitride, or silicon carbide, etc. As shown in FIG. 2C, fixed plugs 26 are formed in the sacrificial layer 24 and connected to the substrate 22. The fixed plugs 26 can be formed by, for example, lithography, etching, deposition, and chemical mechanical polishing, which are well known by one skilled in this field and therefore the details are omitted.

Figure 2D:
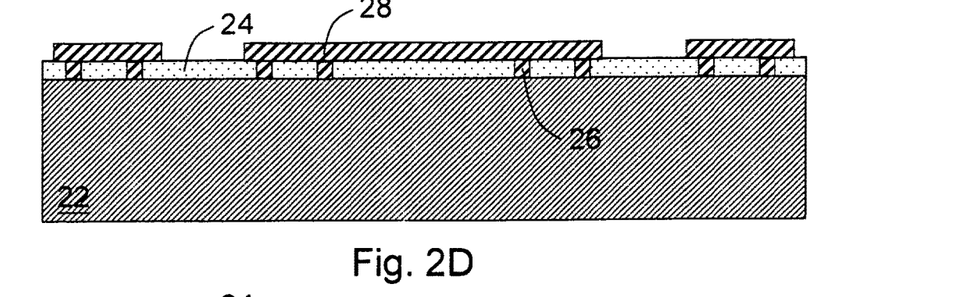
Figure 2E:
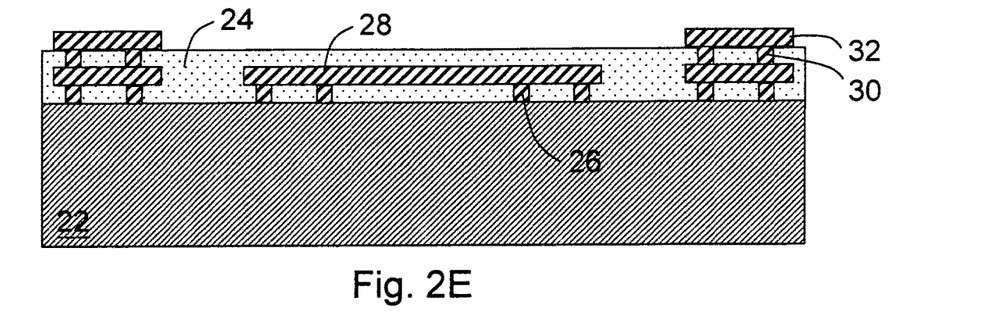
Figure 2F:
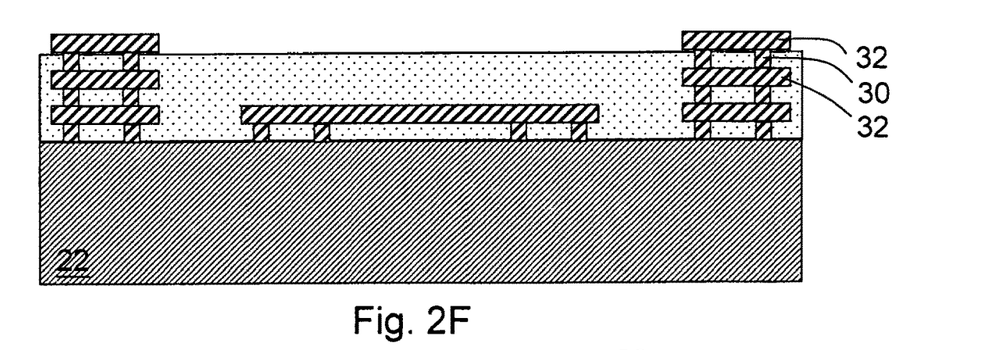
Figure 2G:
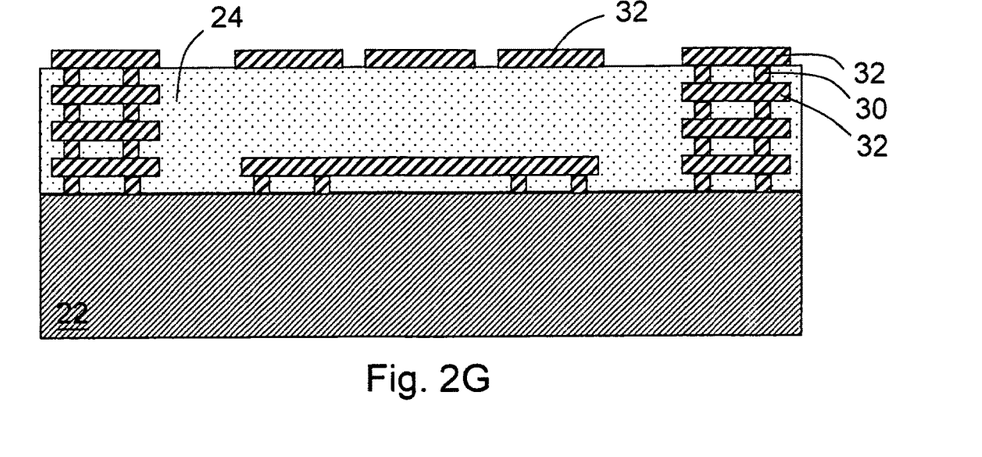
Figure 2H:
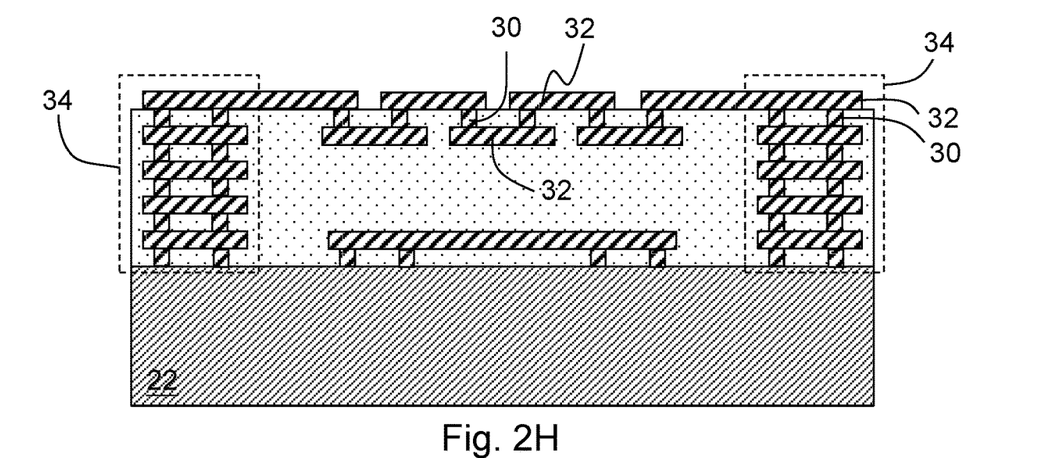

As shown in FIG. 2D, a fixed electrode 28 is formed on the sacrificial layer 24 and is connected to the substrate 22 via the fixed plugs 26. The fixed electrode 28 includes, for example, metal or polysilicon; it acts as a bottom capacitor plate for sensing acoustic pressure in the MEMS acoustic pressure sensor device. As shown in FIG. 2E, another sacrificial layer 24, metal plugs 30 and a metal layer 32 are formed on the fixed electrode 28. As shown in FIGS. 2F and 2G, another sacrificial layer 24, other metal plugs 30 and another metal layer 32 are formed on the previously formed metal layer 32, and as shown in FIG. 2H, a further other sacrificial layer 24, further other metal plugs 30 and a further other metal layer 32 are formed on the previously formed metal layer 32. As shown in FIG. 2H, supporting structure 34 and a top capacitor plate for sensing acoustic pressure in the MEMS acoustic pressure sensor device are formed. In addition, FIG. 2H also shows that the top capacitor plate comprises multiple metal layers 32 and each metal layer includes multiple metal sections, wherein the multiple metal sections of one metal layer and those of at least another metal layer are staggered so that the top capacitor plate of the MEMS acoustic sensor device of the present invention forms a substantially blanket surface from top view, but the top capacitor plate includes openings at its lateral sides (that is, the metal plugs 30 in the top capacitor plate do not completely seal the lateral sides of the top capacitor plate), to allow vapor to pass through the openings of the top capacitor plate for etching the sacrificial layer 24. The top capacitor plate is not limited to including only two metal layers shown in the figure, but may include more layers, which will be explained in more detail with reference to the examples shown in FIGS. 5A-5J, 6A-6D and 7A-7F. Furthermore, the wording "substantially blanket surface from top view" means that in a substantial area of the top capacitor plate, from top view, one can not see through the top capacitor plate from above its top layer to below its bottom layer. In other words, the multiple metal sections of each metal layer 32 and those of at least another metal layer 32 are staggered to form a substantially blanket surface as viewed from a moving direction of an acoustic wave when a multilayer structure 36 (shown in FIG. 2I) receives acoustic pressure.

Figure 2I:
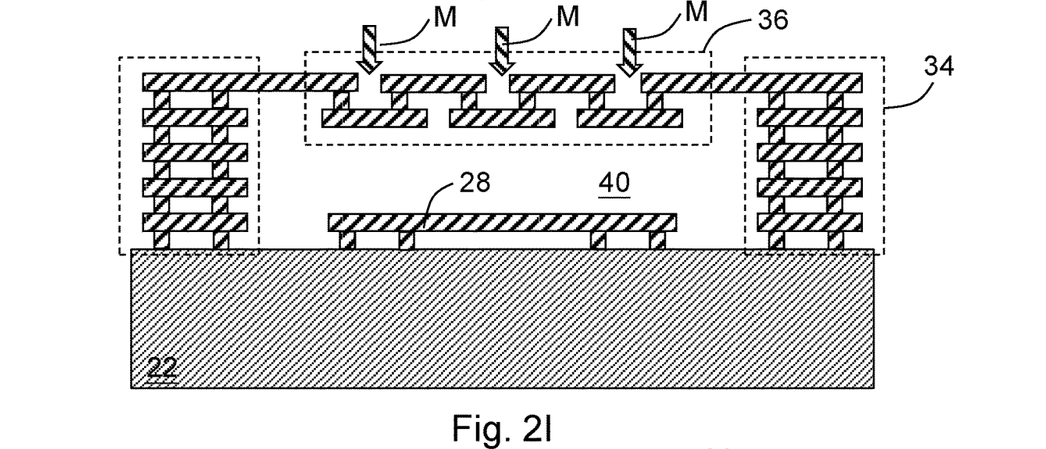

As shown in FIG. 2I, after the top capacitor plate is formed, it is released to become the multilayer structure 36 by isotropic etch of the sacrificial layer 24, so that the top capacitor plate is movable to sense acoustic pressure; a cavity 40 is also formed by the same process, wherein the isotropic etch includes, for example, reactive ion etch (RIE), plasma etch or HF vapor etch. Further, as shown in the figure, the supporting structure 34 is fixed on the substrate 22 and connected with the multilayer structure 36 to support the multilayer structure 36.

According to the present invention, the top capacitor plate includes the multilayer structure 36 which divides each metal layer into multiple sections; this prevents stress from accumulated in one large area. Although the top capacitor plate is divided into multiple small sections in each layer, the multilayer structure 36 forms a substantially blanket surface from top view, so the acoustic pressure can adequately act on the top capacitor plate as a whole. The multilayer structure 36 is also advantageous with respect to manufacture, because the multilayer structure 36 includes openings at its lateral sides (the metal plugs 30 do not completely seal the lateral sides), which facilitate removing the sacrificial layer 24 by etch.

Figure 2J:
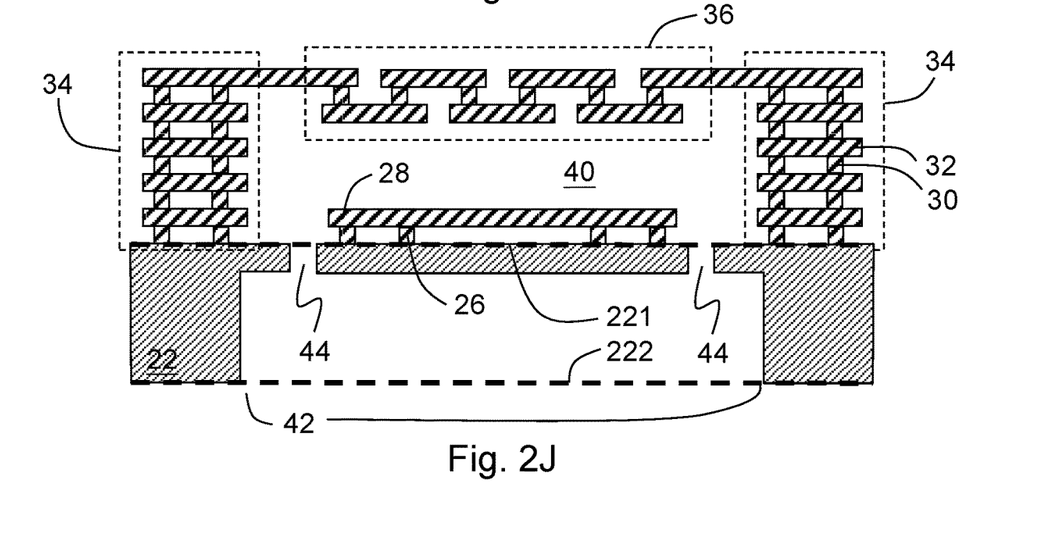

Referring to the cross-section view of FIG. 2J, the substrate 22 includes a top surface 221 and a bottom surface 222 as indicated by the thick dashed lines; from the bottom surface 222, the substrate 22 can be partially removed to form an opening 42, by inductively coupled plasma (ICP) or other anisotropic etch processes. Vents 44 are formed by lithography and etch from the opening 42 to the top surface 221. The vents 44 connects the cavity 40 with the opening 42 for adjusting pressure inside the cavity 40.

Figure 3:
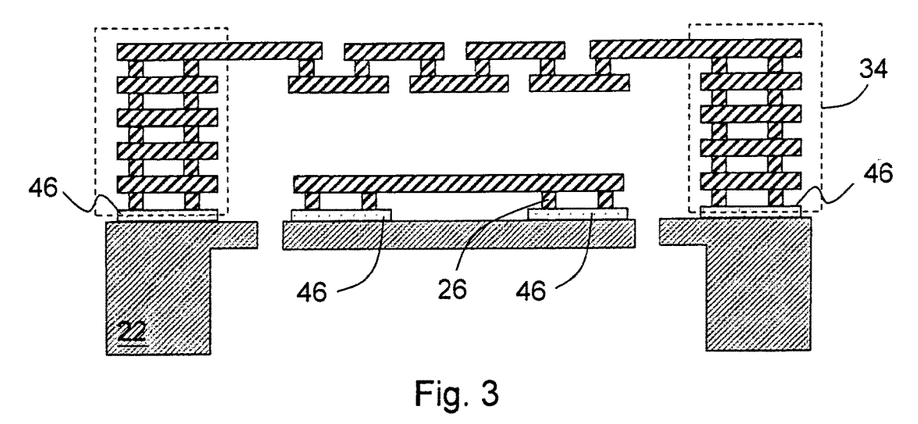
FIG. 3 shows a second embodiment of the present invention.

FIG. 3 shows a second embodiment of the present invention, wherein the MEMS pressure sensor device of the present invention may further include an insulating layer 46 connected between the supporting structure 34 and the substrate 22, and/or connected between the fixed plugs 26 and the substrate 22. The insulating layer 46 can serve to insulate electrical connection or to act as an adhesion layer.

Figure 4:
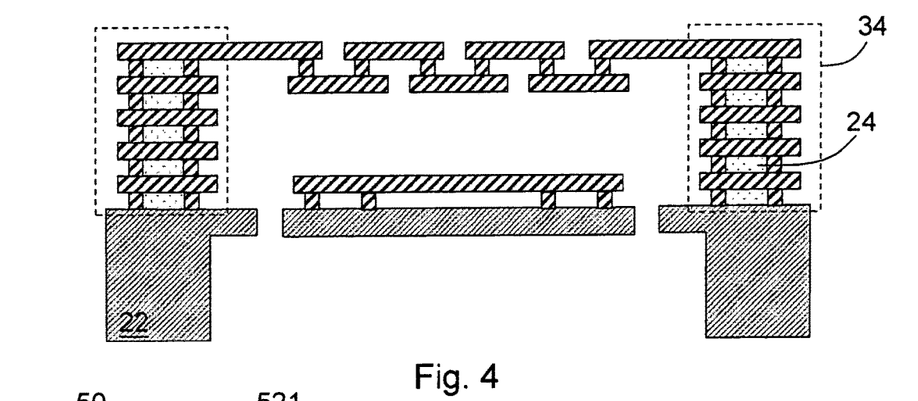
FIG. 4 shows a third embodiment of the present invention.

FIG. 4 shows a third embodiment of the present invention. Different from the first embodiment, the supporting structure 34 in this embodiment may further include sacrificial layers 24 between the multiple metal layers 32 as shown in the figure. The sacrificial layers 24 can enhance the strength of the support structure 34 such that the MEMS acoustic pressure sensor device of the present invention has a better mechanical strength.

Figures 5A, 5B:
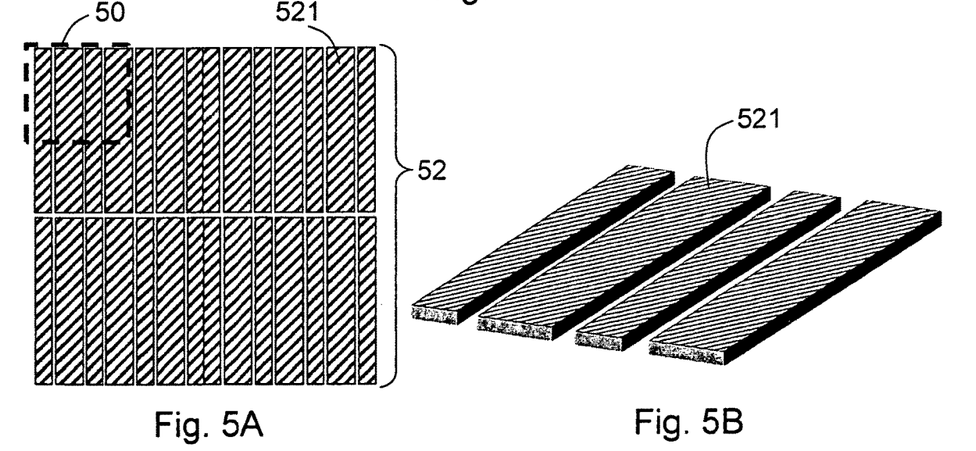
FIGS. 5A-5J show a fourth embodiment of the present invention.

FIGS. 5A-5J show a fourth embodiment of the present invention, which is an embodiment of the multilayer structure 36, by top view and three-dimensional perspective view. FIG. 5A shows a top view of the bottom metal layer 52 of the top capacitor plate, and for convenience, let us assume that the metal layer 52 is the fourth metal layer in the manufacturing process. FIG. 5B shows the region 50 in FIG. 5A by three-dimensional perspective view. As shown in FIGS. 5A-5B, the fourth metal layer 52 includes multiple metal sections 521 which, for example, are arranged in parallel with one another and have gaps in between.

Figure 5C:
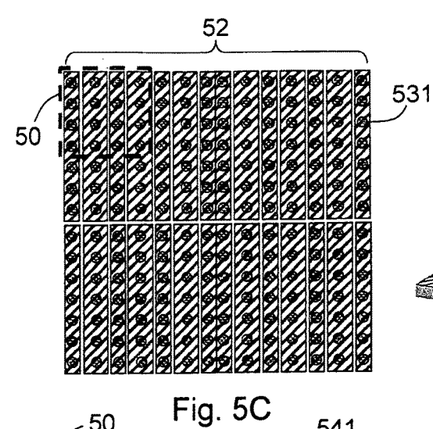
Figure 5D:
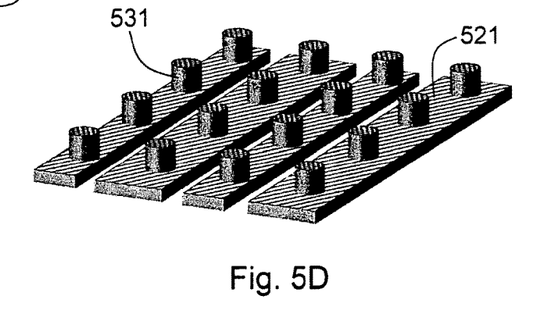
Figure 5E:
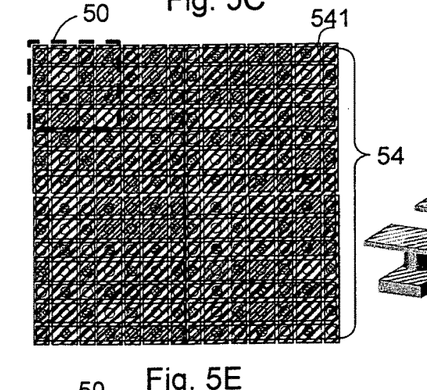
Figure 5F:
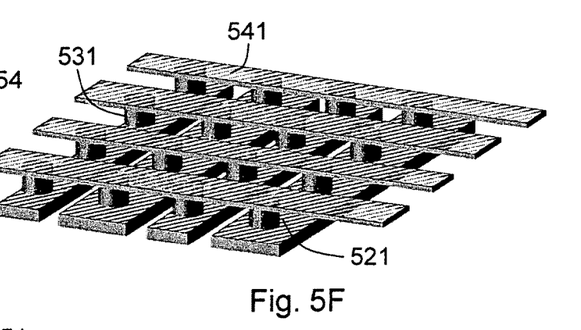

Referring to FIGS. 5C-5D, from top view and three-dimensional perspective view, multiple first metal plugs 531 are formed on the fourth metal layer 52. Referring to FIGS. 5E-5F, from top view and three-dimensional perspective view, a fifth metal layer 54 is formed on the multiple first metal plugs 531. As shown in FIGS. 5E-5F, the fifth metal layer 54 includes multiple metal sections 541 which, for example, are arranged in parallel with one another and have gaps in between, and the multiple metal sections 541 of the fifth metal layer 54 and the multiple metal sections 521 of the fourth metal layer 52 are staggered. The word "staggered" means that the multiple metal sections 541 are not parallel to the multiple metal sections 521, but overlap portions of the multiple metal sections 521 from top view.

Figure 5G:
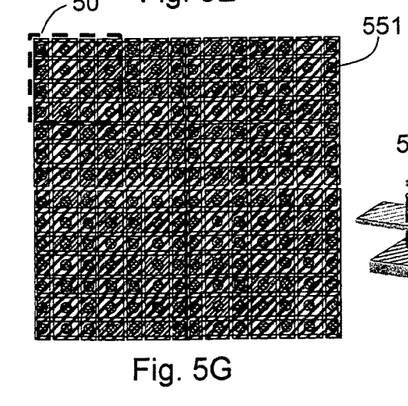
Figure 5H:
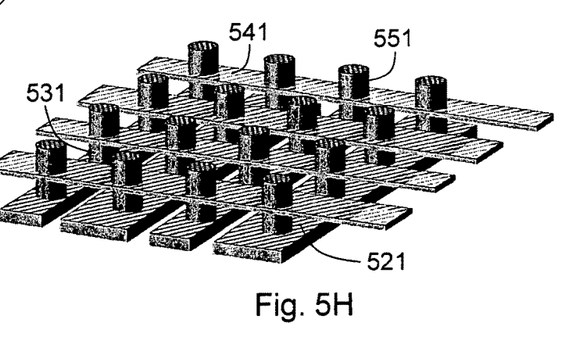
Figure 5I:
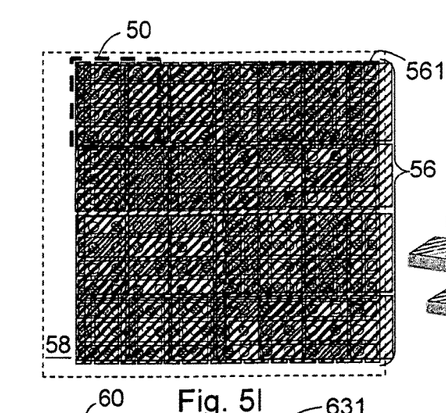
Figure 5J:
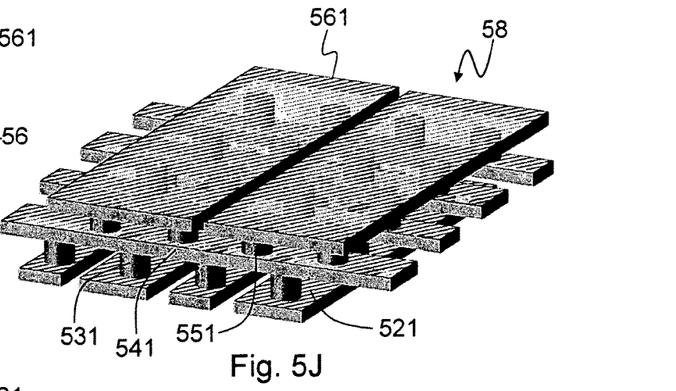

Referring to FIGS. 5G-5H, from top view and three-dimensional perspective view, multiple second metal plugs 551 are formed on the fifth metal layer 54. Referring to FIGS. 5I-5J, from top view and three-dimensional perspective view, a sixth metal layer 56 is formed on the multiple second metal plugs 551. As shown in FIGS. 5I-5J, the sixth metal layer 56 includes multiple metal sections 561 which, for example, are arranged in parallel with one another and have gaps in between, and the multiple metal sections 561 of the sixth metal layer 56 and the multiple metal sections 541 of the fifth metal layer 54 are staggered so that the multilayer structure 58 forms a substantially blanket surface from top view.

Figures 6A, 6B:
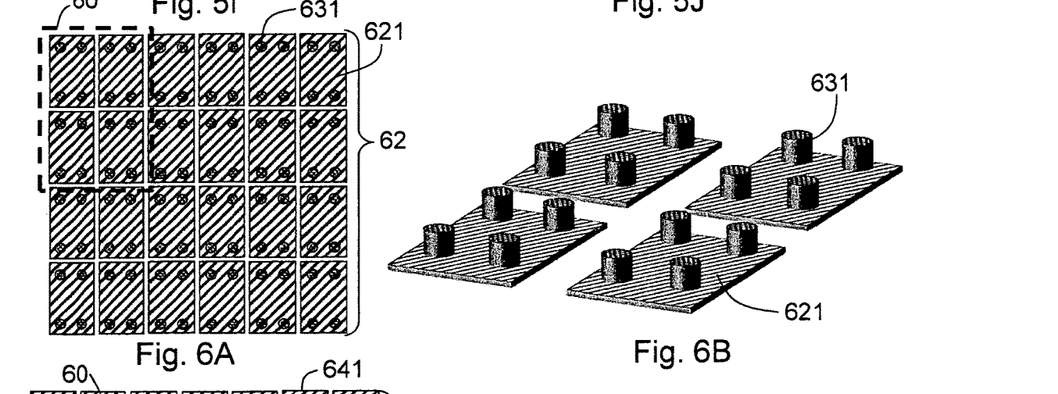
FIGS. 6A-6D show a fifth embodiment of the present invention.

FIGS. 6A-6D show a fifth embodiment of the present invention, which is another embodiment of the multilayer structure 36, by top view and three-dimensional perspective view. The arrangement of the multiple metal sections in this embodiment is different from that in the fourth embodiment. FIG. 6A shows a seventh metal layer 62 and multiple third metal plugs 631 by top view, and FIG. 6B shows a three-dimensional perspective view of the region 60 shown in FIG. 6A. (The serial number "seventh" is for distinguishing the present embodiment from the previous embodiment; it is not necessarily the seventh metal layer in the manufacturing process. So are the other serial numbers below.) As shown in FIGS. 6A-6B, the seventh metal layer 62 includes multiple metal sections 621 which, for example, are arranged in parallel with one another and have gaps in between.

Figure 6C:
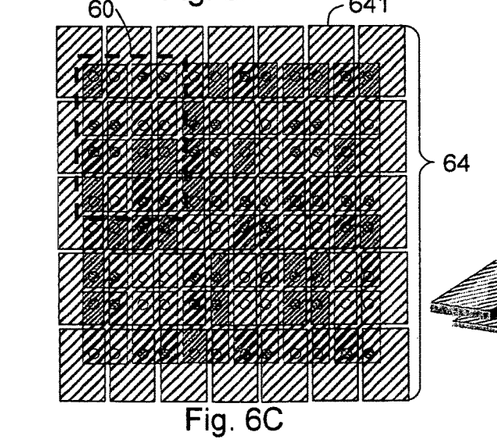
Figure 6D:
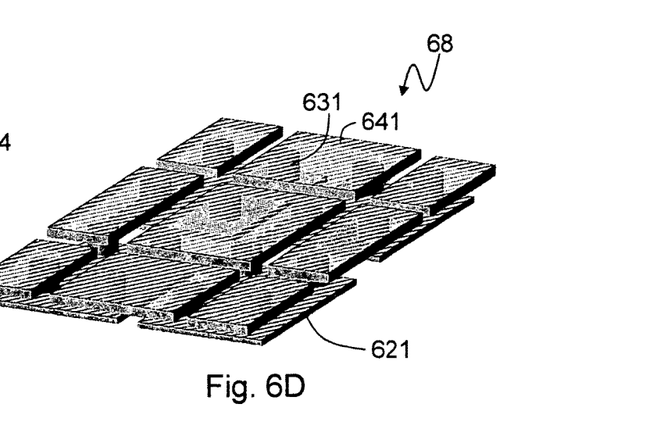

Referring to FIGS. 6C-6D, from top view and three-dimensional perspective view, an eighth metal layer 64 is formed on the multiple third metal plugs 631. As shown in FIGS. 6C-6D, the eighth metal layer 64 includes multiple metal sections 641 which, for example, are arranged in parallel with one another and have gaps in between. Similarly, the multiple metal sections 641 of the eighth metal layer 64 and the multiple metal sections 621 of the seventh metal layer 62 are staggered so that the multilayer structure 68 forms a substantially blanket surface from top view.

Figure 7A:
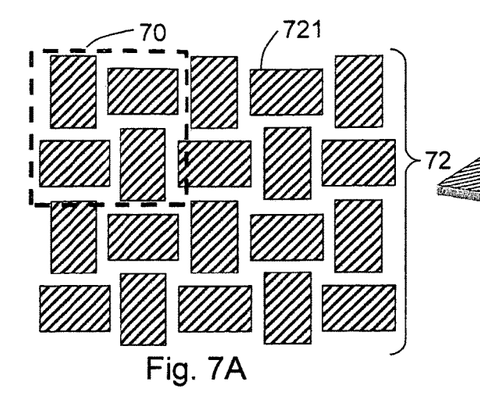
FIGS. 7A-7F show a sixth embodiment of the present invention.
Figure 7B:
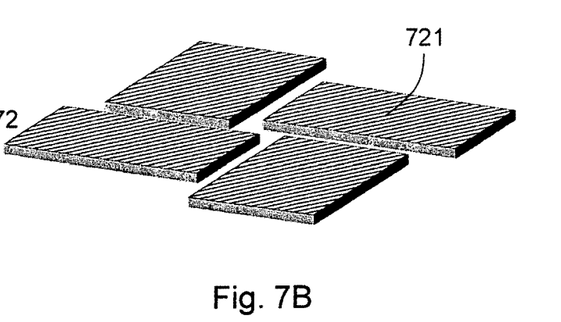

FIGS. 7A-7F show a sixth embodiment of the present invention, which is another embodiment of the multilayer structure 36, by top view and three-dimensional perspective view. Unlike the foregoing embodiments, the multilayer structure in this embodiment forms a almost totally blanket surface from top view. FIG. 7A shows a ninth metal layer 72 by top view while FIG. 7B shows a three-dimensional perspective view of the region 70 shown in FIG. 7A. (The serial number "ninth" is for distinguishing the present embodiment from the previous embodiments; it is not necessarily the ninth metal layer in the manufacturing process. So are the other serial numbers below.) As shown in FIGS. 7A-7B, the ninth metal layer 72 includes multiple metal sections 721 which, for example, are arranged in parallel with one another and have gaps in between.

Figure 7C:
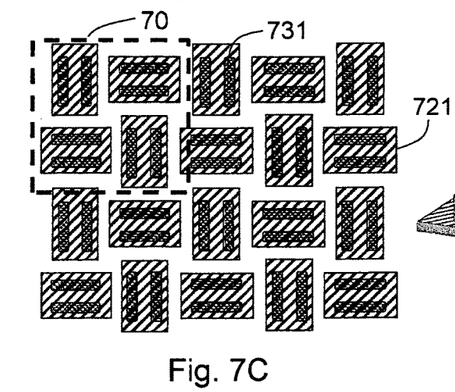
Figure 7D:
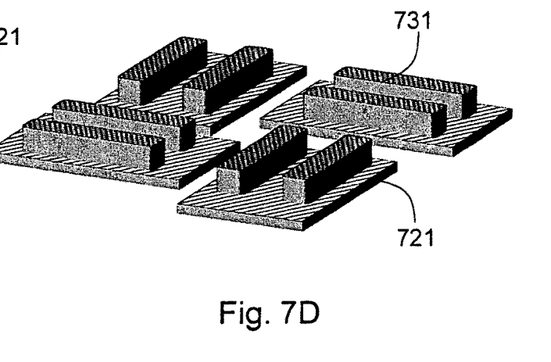
Figure 7E:
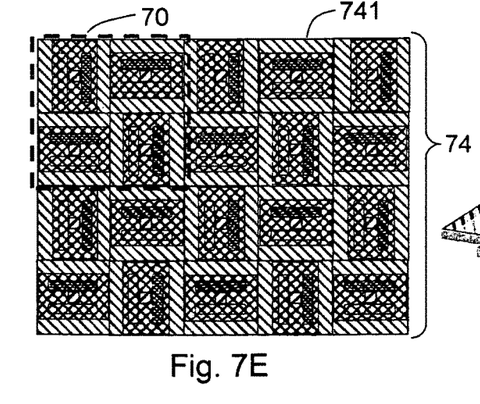
Figure 7F:
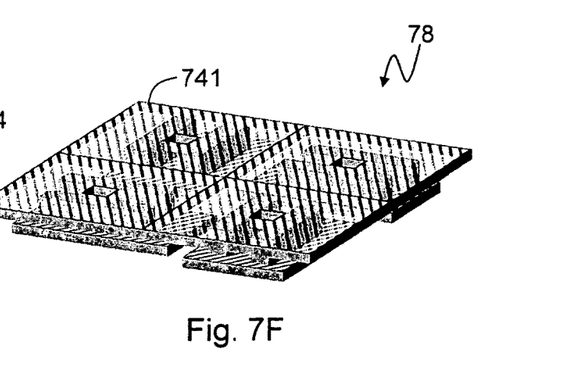

Referring to FIGS. 7C-7D, from top view and three-dimensional perspective view, multiple fourth metal plugs 731 are formed on the ninth metal layer 72. Referring to FIGS. 7E-7F, from top view and three-dimensional perspective view, a tenth metal layer 74 are formed on the multiple fourth metal plugs 731. As shown in FIGS. 7E-7F, the tenth metal layer 74 includes multiple metal sections 741 which, for example, are very close to each other but have seams in between. Further, the multiple metal sections 741 of the tenth metal layer 74 and the multiple metal sections 721 of the ninth metal layer 72 are staggered so that the seams between the multiple metal sections 741 do not totally overlap the gaps between the multiple metal sections 721 from top view. The tenth metal layer 74 overlaps a portion of the ninth metal layer 72 so that the multilayer structure 78 forms a substantially blanket surface from top view.

In the foregoing embodiments, preferably, each metal layer includes at least one material of gold, silver, titanium, tantalum, copper, aluminum, titanium carbide, tantalum carbide, copper carbide, aluminum carbide, titanium oxide, tantalum oxide, copper oxide, aluminum oxide, titanium nitride, tantalum nitride, copper nitride, or aluminum nitride. Preferably, each metal plug includes at least one material of tungsten, gold, silver, titanium, tantalum, copper, aluminum, tungsten carbide, titanium carbide, tantalum carbide, copper carbide, aluminum carbide, tungsten oxide, titanium oxide, tantalum oxide, copper oxide, aluminum oxide, titanium nitride, tungsten nitride, tantalum nitride, copper nitride, or aluminum nitride.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, the number of the metal layers in the present invention is not limited to the number shown in the embodiments, but can be any other number. As another example, it is not necessary for the staggered multiple metal sections to belong to two neighboring metal layers, but can belong to two metal layers with one or multiple metal layers between them as long as the multilayer structure forms a substantially blanket surface from top view. As another example, the number of the fixed plug or metal plug in each layer is not limited to one, but can be plural. As another example, from top view, each metal section, fixed plug or metal plug is not limited to a rectangle shape or a circle shape as shown in the figures, but also can be any other shape. Likely, other structures shown in the embodiments are not limited to the shapes as shown, but also can be any other shape. Thus, the present invention should cover all such and other modifications and variations, which should be interpreted to fall within the scope of the following claims and their equivalents.

What is claimed is:
1. A MEMS acoustic pressure sensor device, comprising:
a substrate;
a fixed electrode provided on the substrate; and
a multilayer structure including:
multiple metal layers, wherein each metal layer of the multiple metal layers includes multiple metal sections which are spaced apart from one another at a same layer, so that there is an empty gap between any two neighboring metal sections within one same layer, whereby the multiple metal layers include multiple metal sections at two or more different layers; and multiple metal plugs connecting the multiple metal layers;

wherein a cavity is formed between the multilayer structure and the fixed electrode, and wherein the multiple metal sections of one layer and the multiple metal sections of at least another layer are staggered whereby a top view of a direction orthogonal to the upper surface of the substrate, can not see the upper surface of the substrate from above the multilayer structure downward through the empty gap.

2. The MEMS acoustic pressure sensor device of claim 1, further comprising a supporting structure fixed on the substrate and connected with the multilayer structure for supporting the multilayer structure.

3. The MEMS acoustic pressure sensor device of claim 2, further comprising an insulating layer connected between the supporting structure and the substrate.

4. The MEMS acoustic pressure sensor device of claim 1, wherein each metal layer overlaps a portion of at least another metal layer from the top view.

5. The MEMS acoustic pressure sensor device of claim 1, wherein the multilayer structure includes at least one opening at a lateral side of the multilayer structure.

6. The MEMS acoustic pressure sensor device of claim 1, wherein the substrate includes at least one vent.

7. The MEMS acoustic pressure sensor device of claim 1, wherein each metal layer includes at least one material of gold, silver, titanium, tantalum, copper, aluminum, titanium carbide, tantalum carbide, copper carbide, aluminum carbide, titanium oxide, tantalum oxide, copper oxide, aluminum oxide, titanium nitride, tantalum nitride, copper nitride, or aluminum nitride.

8. The MEMS acoustic pressure sensor device of claim 1, wherein each metal plug includes at least one material of tungsten, gold, silver, titanium, tantalum, copper, aluminum, tungsten carbide, titanium carbide, tantalum carbide, copper carbide, aluminum carbide, tungsten oxide, titanium oxide, tantalum oxide, copper oxide, aluminum oxide, tungsten nitride, titanium nitride, tantalum nitride, copper nitride, or aluminum nitride.

* * * * *